United States Patent
Chobanyan et al.

(10) Patent No.: US 11,191,152 B2
(45) Date of Patent: Nov. 30, 2021

(54) PRINTED CIRCUIT BOARD SIGNAL LAYER TESTING

(71) Applicant: Hewlett Packard Enterprise Development LP, Houston, TX (US)

(72) Inventors: Elene Chobanyan, Fort Collins, CO (US); Karl J. Bois, Fort Collins, CO (US); Christian Olsen, Quebec (CA)

(73) Assignee: Hewlett Packard Enterprise Development LP, Houston, TX (US)

( * ) Notice: Subject to any disclaimer, the term of this patent is extended or adjusted under 35 U.S.C. 154(b) by 133 days.

(21) Appl. No.: 16/252,016

(22) Filed: Jan. 18, 2019

(65) Prior Publication Data

US 2020/0236777 A1    Jul. 23, 2020

(51) Int. Cl.
| | | |
|---|---|---|
| *G01R 31/00* | (2006.01) | |
| *H05K 1/02* | (2006.01) | |
| *G01R 31/28* | (2006.01) | |
| *G01R 27/26* | (2006.01) | |

(52) U.S. Cl.
CPC ....... *H05K 1/0268* (2013.01); *G01R 27/2617* (2013.01); *G01R 31/2818* (2013.01)

(58) Field of Classification Search
CPC ............ G01R 27/2617; G01R 31/2818; H05K 1/025; G06F 30/39; G06F 30/36
See application file for complete search history.

(56) References Cited

U.S. PATENT DOCUMENTS

| | | | | |
|---|---|---|---|---|
| 5,521,513 A | * | 5/1996 | Stringer | G01R 31/2806 324/527 |
| 6,411,108 B1 | * | 6/2002 | Douglas | G01R 1/07 324/658 |
| 6,445,204 B1 | * | 9/2002 | He | G01R 31/2818 324/754.03 |
| 6,670,816 B2 | | 12/2003 | Kim et al. | |
| 8,035,409 B2 | | 10/2011 | Deutsch et al. | |
| 9,086,368 B2 | | 7/2015 | Kuczynski et al. | |
| 2014/0034376 A1 | * | 2/2014 | Biddle | H01P 5/028 174/268 |

FOREIGN PATENT DOCUMENTS

| | | |
|---|---|---|
| CN | 103995185 | 8/2014 |
| RU | 2646550 | 3/2018 |

* cited by examiner

*Primary Examiner* — Jermele M Hollington
*Assistant Examiner* — Taqi R Nasir
(74) *Attorney, Agent, or Firm* — Hewlett Packard Enterprise Patent Department

(57) ABSTRACT

A printed circuit board (PCB) may include a signal layer having a functional region and a PCB signal layer testing region. The PCB signal layer testing region may include a first differential pair having a first length formed on the signal layer, a second differential pair having a second length, different than the first length, formed on the signal layer and a third differential pair having a third length, different than the first length and different than the second length, formed on the signal layer.

19 Claims, 10 Drawing Sheets

PRINTED CIRCUIT BOARD SIGNAL LAYER TESTING

BACKGROUND

Printed circuit boards (PCBs) are generally formed from flat sheets of insulating material upon layers of a conductive material, such as copper foils, are laminated and patterned. Printed circuit boards are used to mechanically support and electrically connect electronic components or electrical components using circuit traces, contact pads/terminals and vias. Printed circuit boards may be single-sided, double-sided or multilayered. One example of an insulating material used to form PCBs is FR-4 glass epoxy.

Dielectric properties of different PCBs may be evaluated by determining propagation constant values for the PCBs. A propagation constant is a measure of the change of the amplitude and phase of a sinusoidal wave as it propagates in a given direction through the printed circuit board. The propagation constant, also referred to as a transmission parameter, transmission function, propagation coefficient, propagation constant or transmission constant, is composed of (a) and attenuation constant (also referred to as an attenuation parameter or attenuation coefficient) and (b) a phase constant, also referred to as a phase change constant, parameter or coefficient.

Figure 1:
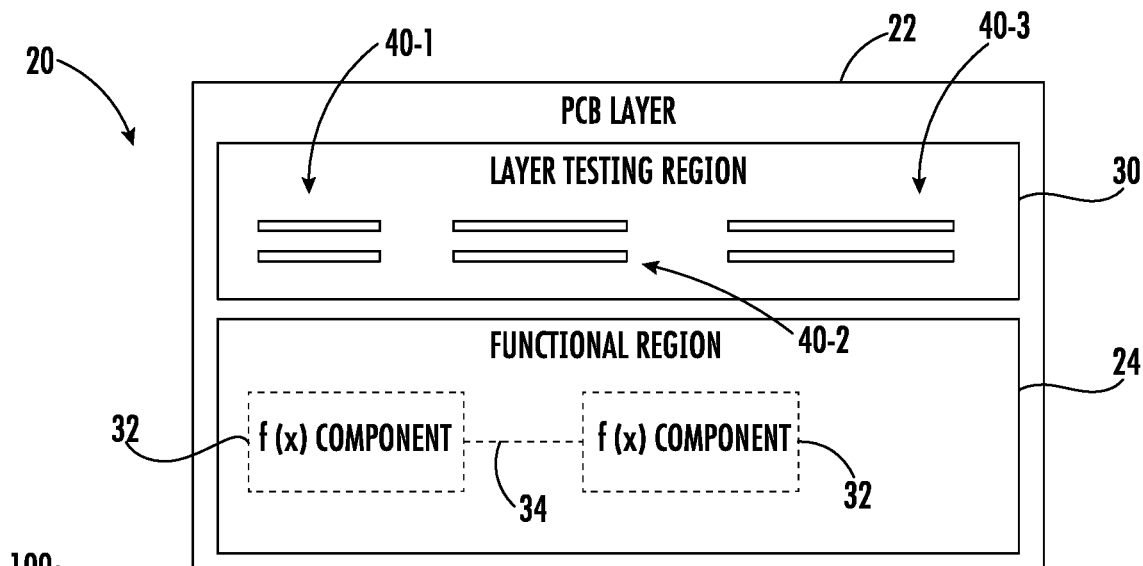
FIG. 1 is a top view schematically illustrating portions of an example PCB.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION OF EXAMPLES

Disclosed herein are example printed circuit boards and PCB signal layer testing methods that facilitate accurate testing of material properties of the printed circuit boards. The disclosed printed circuit boards and PCB signal layer testing methods utilize at least three differential pairs of different lengths for testing the material properties of the printed circuit boards. Measurements from the three differential pairs of different lengths facilitates least square regression of the results to provide more accurate attenuation constant estimates and more accurate propagation constant estimates.

In one implementation, the first differential pair has a length of at least 2 inches and no greater than 4 inches. The second differential pair has a length of at least 4 inches and no greater than 5 inches. The third differential pair has a length of at least 4.5 inches and no greater than 10 inches. These different lengths of differential pairs provide more accurate attenuation constant estimates and more accurate propagation constant estimates for the particular PCB being evaluated.

Disclosed herein are example multilayer printed circuit boards that further facilitate the testing of PCB material properties using less space or real estate. The example multilayer printed circuit boards comprise a stack of signal layers. Each signal layer has a functional region and a PCB signal layer testing region. Each of the different PCB signal layer testing regions contains at least one differential pair for the evaluation of a propagation constant and dielectric material properties of the particular signal layer. The differential pairs of the different signal layers may be similar in shape and length. The differential pairs of the different signal layers have overlapping portions that are directly under one another, but with their connection terminals being offset on the topmost or bottommost signal layer of the PCB. The overlapping differential pairs with offset surface terminals provides a more compact arrangement, conserving valuable real estate or space for component placement and routing in the top and bottom signal layers and also the routing space in all other signal layers as well.

In some implementations, each signal layer of the stack of layers forming the PCB comprises overlapping differential pairs. In other implementations, some of the signal layers may omit overlapping differential pairs or may omit differential pairs altogether. For example, in some implementations, signal layers not used for high-speed signal routing may omit differential pairs. For example, in one implementation, middle layers of a stack of signal layers may include overlapping differential pairs while one or both of the top and bottom signal layers may omit differential pairs.

Disclosed herein is an example PCB that may include a signal layer having a functional region and a PCB signal layer testing region. The PCB signal layer testing region may include a first differential pair having a first length formed on the signal layer, a second differential pair having a second length, different than the first length, formed on the signal layer and a third differential pair having a third length, different than the first length and different than the second length, formed on the signal layer.

Disclosed herein is an example PCB signal layer testing method. The method comprises receiving a first electrical measurement taken from a first differential pair on a PCB signal layer, wherein the first differential pair has a first length. The method comprises receiving a second logical measurement taken from a second differential pair on the PCB signal layer. The second differential pair has a second length different than the first length. The method comprises receiving a third electrical measurement taken from a third differential pair on the PCB signal layer. The third differential pair has a third length different than the first length and different than the second length. A propagation constant value may be determined at each measured frequency for the PCB signal layer based upon a combination of each of the first electrical measurement, the second electrical measurement in the third electrical measurement. An average relative permittivity of the signal layer at each measured frequency may be determined using propagation constant values for the PCB signal layer based upon a combination of each of the first electrical measurement, the second electrical measurement and the third electrical measurement.

Disclosed herein is an example PCB in the form of a stack of signal layers. The stack may include a first signal layer comprising a first functional region and a first PCB signal layer testing region. The first PCB signal layer testing region may include a first differential pair. The stack of signal layers may further comprise a second signal layer having a second functional region and a second PCB signal layer testing region. The second PCB signal layer testing region may include a second differential pair. The first differential pair and the second differential pair are similar in shape and length. At least a portion of the first differential pair directly overlies a portion of the second differential pair.

FIG. 1 is a top view schematically illustrating portions of an example printed circuit board 20. FIG. 1 is a top view of a single signal layer (stripline signal layer) 22 of printed circuit board 20. Although not shown, printed circuit board 20 may include additional layers such as a power layer and a ground layer. In one implementation, printed circuit board 20 may consist of a single signal layer, a reference ground layer and the dielectric between them. In other implementations, printed circuit board 20 may be a multilayer PCB, a PCB comprising multiple signal layers, wherein the internal signal layers are sandwiched between two ground layers.

As schematically shown by FIG. 1, PCB signal layer 22 comprises a functional region 24 and a signal layer testing region 30. Functional region 24 comprises those portions of signal layer 22 that contain functional components, such as components 32 (shown in broken lines), connected by circuit traces 34. Functional region 24 contains those functional components 32 that serve to provide the functions associated with PCB 20. Functional region 24 covers a majority of the available area of PCB 20.

Layer testing region 30 comprises those portions of the surface of signal layer 22 that do not contain functional components 32 or their associate electrical traces or circuit traces 34. Signal layer testing region 30 may generally extend along a perimeter of PCB 22. In some implementations, signal layer testing region 30 may extend along opposite sides are opposite ends of functional region 24. Signal layer testing region 30 is generally the leftover space on each signal layer 22 after the functional region 24 has been laid out and patterned. Signal layer testing region 30 contains various electrical or conducting structures that facilitate the testing of the material properties of the particular signal layer 22 or of PCB 20 in general. Signal layer testing region 30 includes, amongst such testing structures, three differential pairs 40-1, 40-2 and 40-3 (collectively referred to as differential pairs 40).

Differential pairs 40 each comprise an electrically conductive pair of traces formed in or on signal layer 22. Such differential pairs are used for differential signaling, a method for electrically transmitting information using two complementary signals. Such differential signaling sense the same electrical signal as a differential pair of signals, each in its own conductor or trace of the pair of traces. Each of the pairs 40 is comprised of two identical electrically conductive lines extending generally alongside one another as a pair. Each pair has a different length, the distance between ends or terminals of each electric conductive trace or line. In one implementation, differential pair 40-1 has a length of at least 2 inches and no greater than 4 inches. Differential pair 40-2 has a length of at least 4 inches and no greater than 5 inches. Electric conductive pair 40-3 has a length of at least 4.5 inches and no greater than 10 inches. In the example illustrated, differential pair 40-1 has a length of 4 inches (4000 mils), differential pair 40-2 has a length of 4.134 inches (4134 mils) and differential pair 40-3 has a length of 4.897 inches (4897 mils). Because signal layer testing region 30 comprises at least three differential pairs, each pair having a different length with respect to the other pairs, the measurement performed using pairs 40 provides more accurate estimates for the propagation constant which may yield more accurate estimates for dielectric properties for the particular PCB signal layer 22. In those particular implementations where the differential pairs 40 have lengths within the three above described ranges, the accuracy of the propagation constants and dielectric property estimates is further enhanced.

Figure 2:
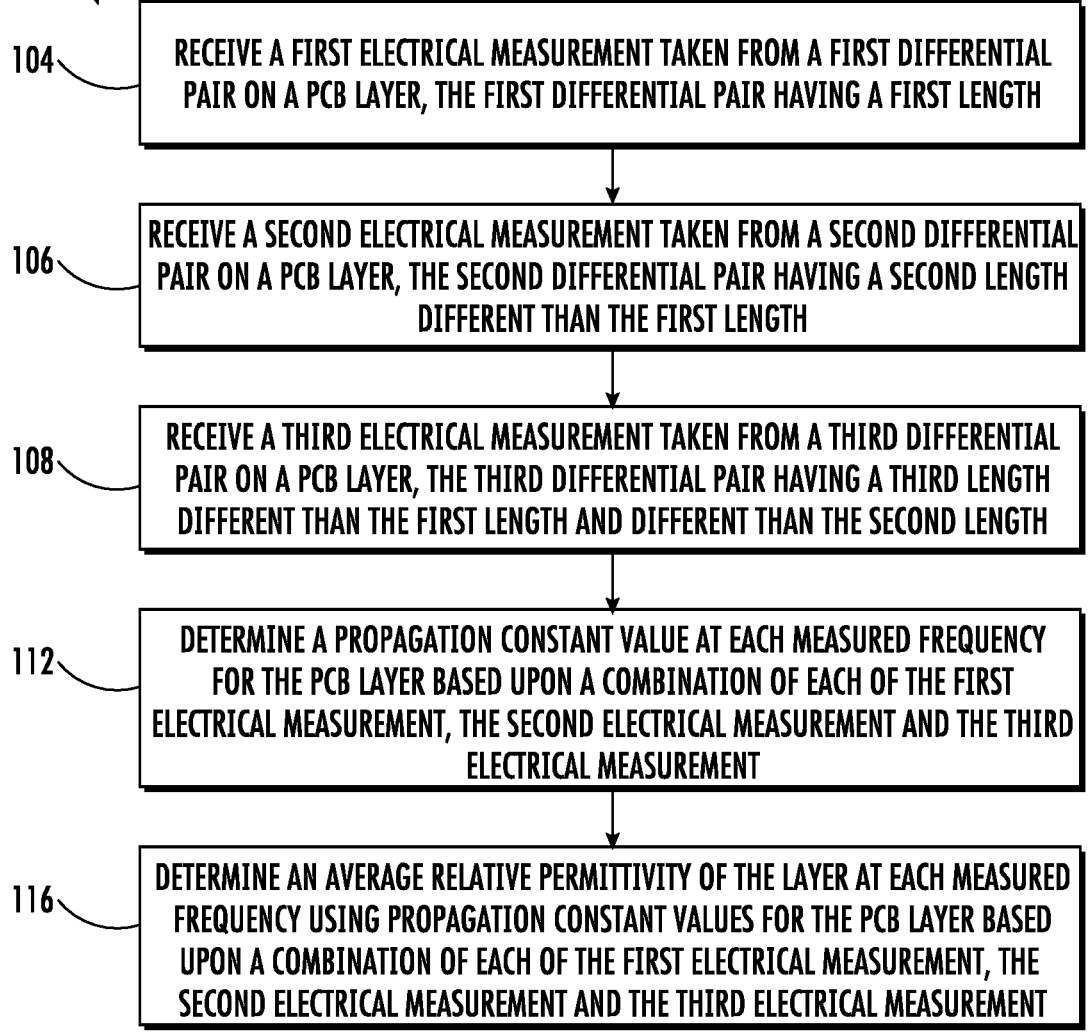
FIG. 2 is a flow diagram of an example method for evaluating material properties of a signal layer of a PCB.

FIG. 2 is a flow diagram of an example PCB signal layer testing method 100. PCB signal layer testing method 100 facilitates accurate testing of material properties of the printed circuit boards. Although method 100 is described in the context of being carried out with signal layer 22 of PCB 20, it should be appreciated that method 100 may be likewise carried out with other signal layers of PCB signal layer 20 or with other similar PCBs.

As indicated by block 104, a PCB evaluation unit, such as a processor that follows instructions contained on a non-transitory computer-readable medium, receives a first electrical measurements taken from a first differential pair, such as differential pair 40-1, on a PCB signal layer, such as PCB signal layer 22, wherein the first differential pair has a first length. As indicated by block 106, the PCB evaluation unit may receive a second electrical measurements taken from a second differential pair, such a differential pair 40-2, on the PCB signal layer 22, wherein the second differential pair has a second length different than the first length. As indicated by block 108, the PCB evaluation unit may receive a third electrical measurement taken from a third differential pair, such as differential pair 40-3, on the PCB signal layer 22, were in the third differential pair has a third length different than the first length and different than the second length.

As indicated by block 112, the PCB evaluation unit may determine a propagation constant value at each measured frequency for the PCB signal layer based upon a combination of each of the first electrical measurement, the second electrical measurement and the third electrical measurement. As indicated by block 116, the PCB evaluation unit may then determine in averaged relative permittivity of the signal layer at each measured frequency using propagation constant values for the PCB signal layer which are based upon a combination of each of the first logical measurement, the second electrical measurement and the third electrical measurement. The determined propagation constant and permittivity of the signal layer may assist in evaluating quality and performance of the PCB being tested.

Figure 3A:
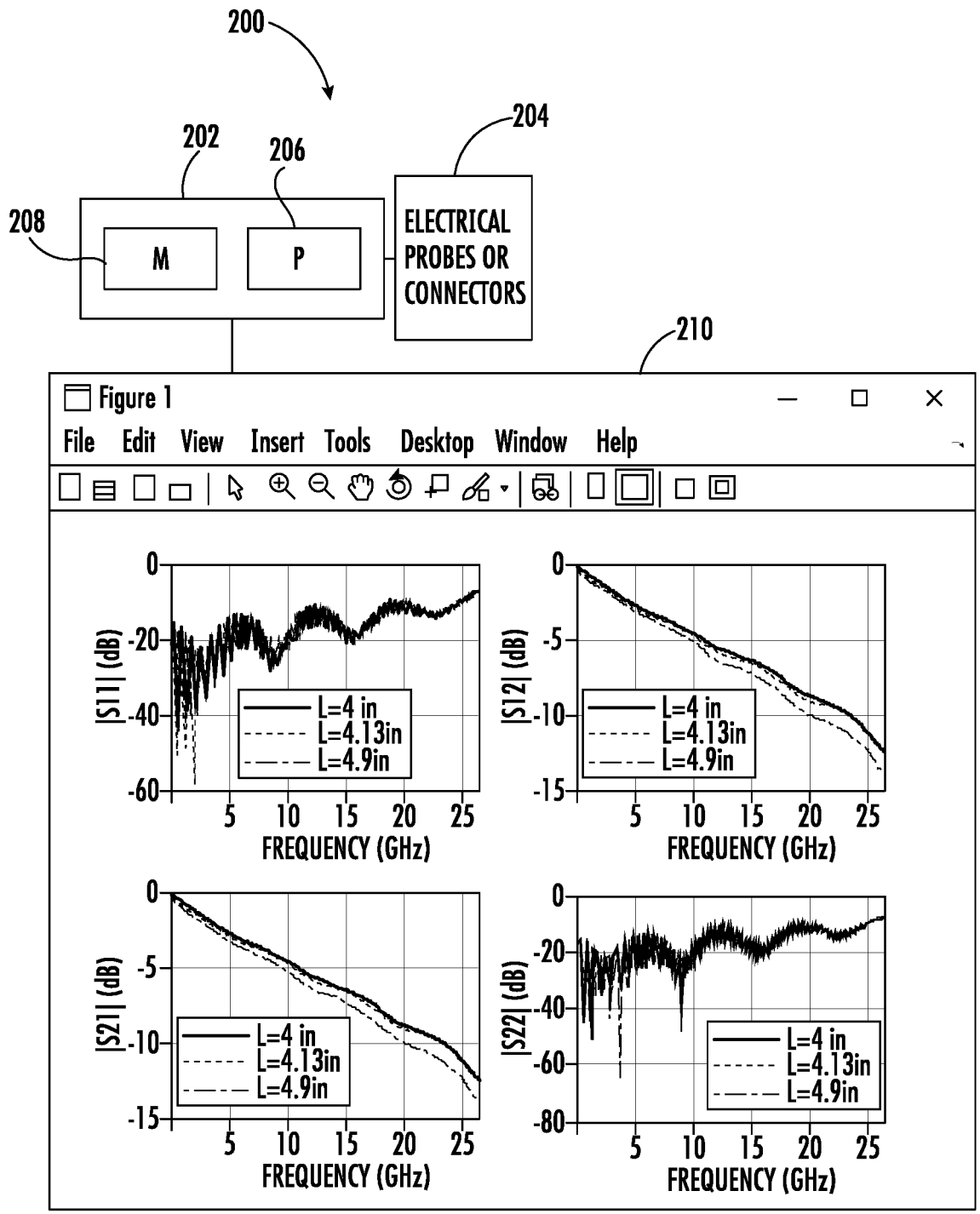
FIG. 3A is a diagram illustrating portions of an example PCB evaluation unit with a display in a first display state.

FIG. 3A is a block diagram of an example PCB evaluation unit 200 for evaluating PCBs. PCB evaluation unit 200 may carry out method 100 described above. As shown by 3, PCB evaluation unit 200 comprises a computing unit 202, electrical probes or electrical connectors 204 and display 210. Computing unit 202 comprises a processor 206 that carries out instructions contained in a non-transitory computer-readable medium 208. In one implementation, the instructions contained in medium 208 direct the processor 206 to carry out method 100 described above.

Electrical probes or connectors 204 comprise electrical contacts which are connectable to the opposite ends or terminals of each of the differential pairs on a PCB signal layer, such as pairs 40 on signal layer 22. The probes or connectors 204 provide the first electrical measurement, the second electrical measurement and the third electrical measurement described in method 100. In other implementations, probes or connectors 204 may be omitted from unit 200, wherein the first electrical measurement, the second electrical measurement and the third electrical measurement are independently taken by separate probes or connectors and wherein the taken measurements are input to unit 202 by one of various interfaces such as a keyboard, touchscreen, auditory input or the like.

Display 210 presents the PCB signal layer evaluation results. In one implementation, display 210 may comprise a touch screen for the input of the first, second and third electrical measurements. In some implementations, display 210 may provide prompts, windows or the like, at which a cursor may be located and at which the three electrical measurements may be input. As shown in FIG. 3A, processor 206, following instructions contained in medium 208 output signals causing display 210 present the electrical measurements for each of the differential pairs 40 taken at different frequencies.

Figure 3B:
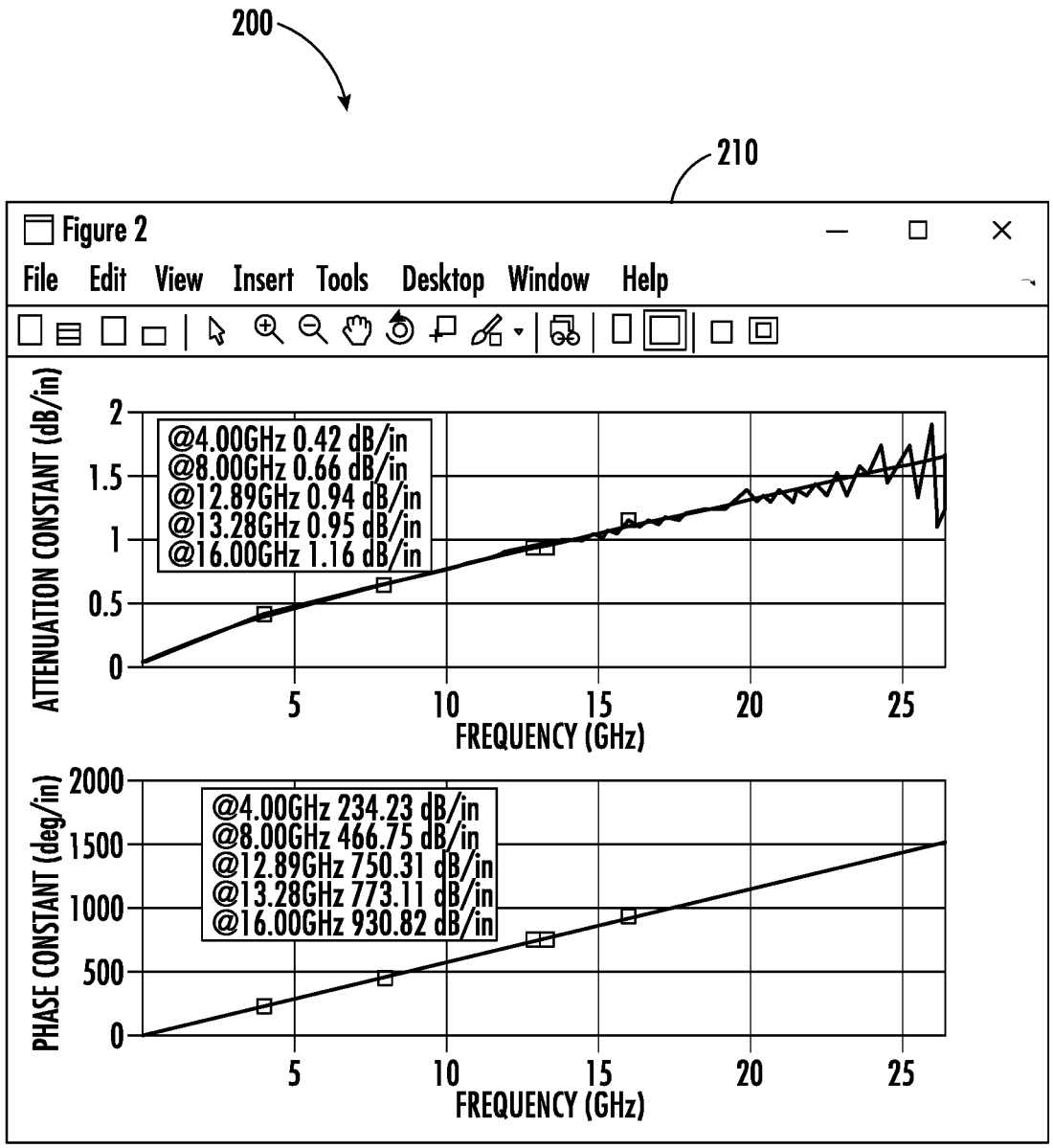
FIG. 3B is a diagram illustrating the example PCB evaluation unit of FIG. 3A with the display in a second display state.

FIG. 3B illustrates display 210 of unit 200 in a different display state. In the state shown in 3B, processor 206, following instructions contained in medium 208, his output control signals causing display 210 to present the determined propagation constant in for of its real part (attenuation constant) and imaginary part (phase constant) results. The results are presented in graphical form. As shown in FIG. 3B, because three different electrical measurements are taken at each frequency for the PCB signal layer, a least-squares regression on computed propagation constant values may be performed. The least squares regression facilitates more accurate results or estimates regarding attenuation constant values determined for the particular PCB signal layer being evaluated.

Figure 3C:
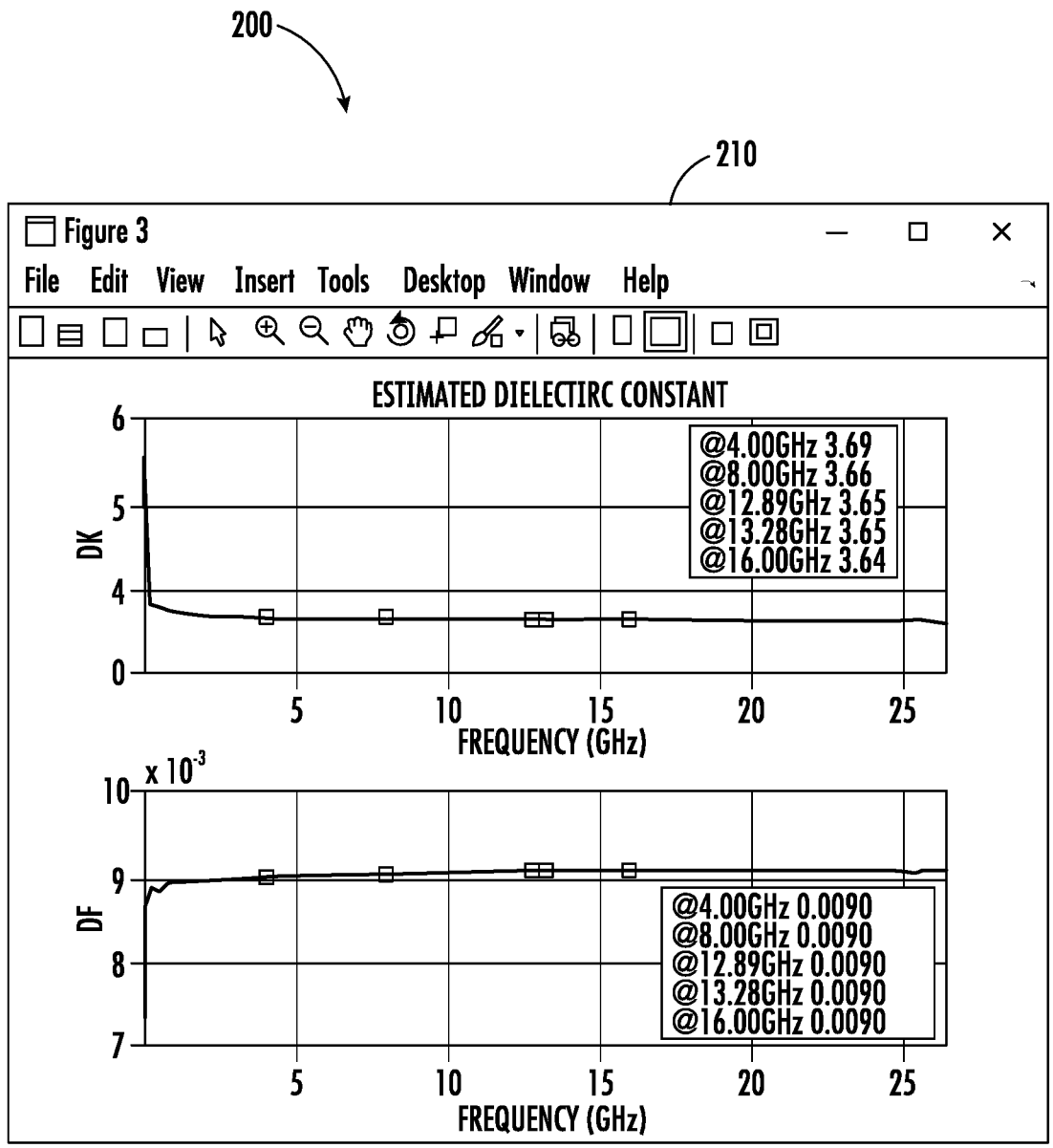
FIG. 3C is a diagram illustrating the example PCB evaluation unit of FIG. 3A with the display in a third display state.

FIG. 3C illustrates display 210 of unit 200 in a different display state. In the state shown in 3B, processor 206, following instructions contained in medium 208, his output control signals causing display 210 to present the determined or estimated dielectric constant values at the different frequencies for the PCB signal layer being evaluated. The results are presented in graphical form.

Figure 4A:
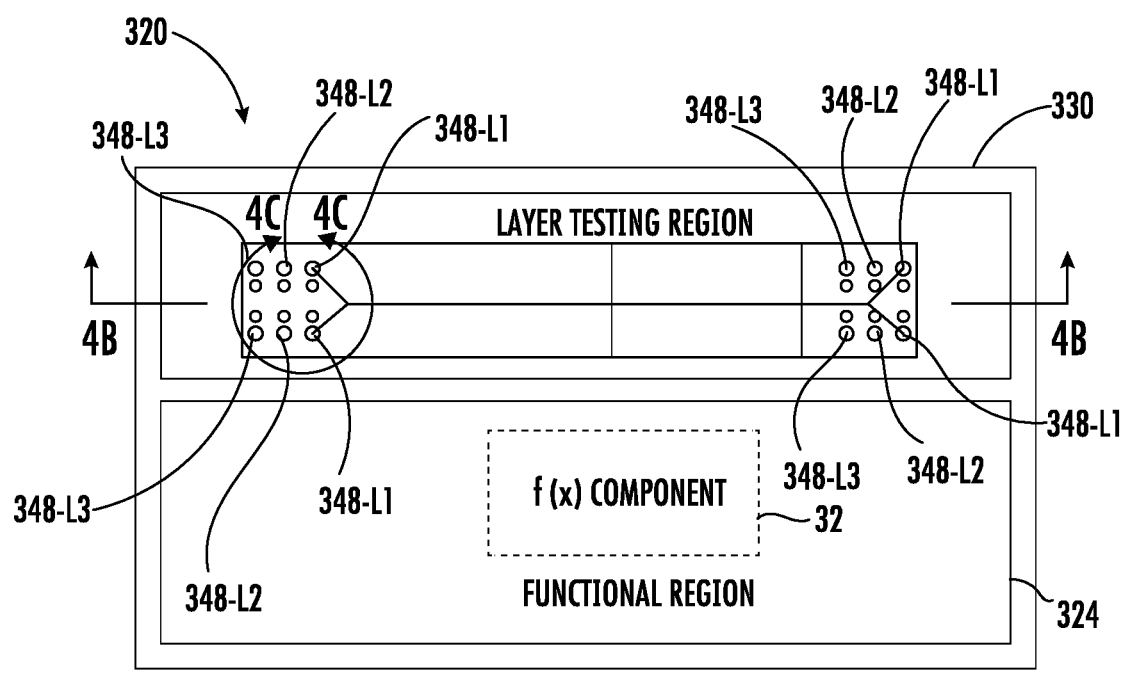
FIG. 4A is a top view schematically illustrating portions of an example PCB.
Figure 4B:
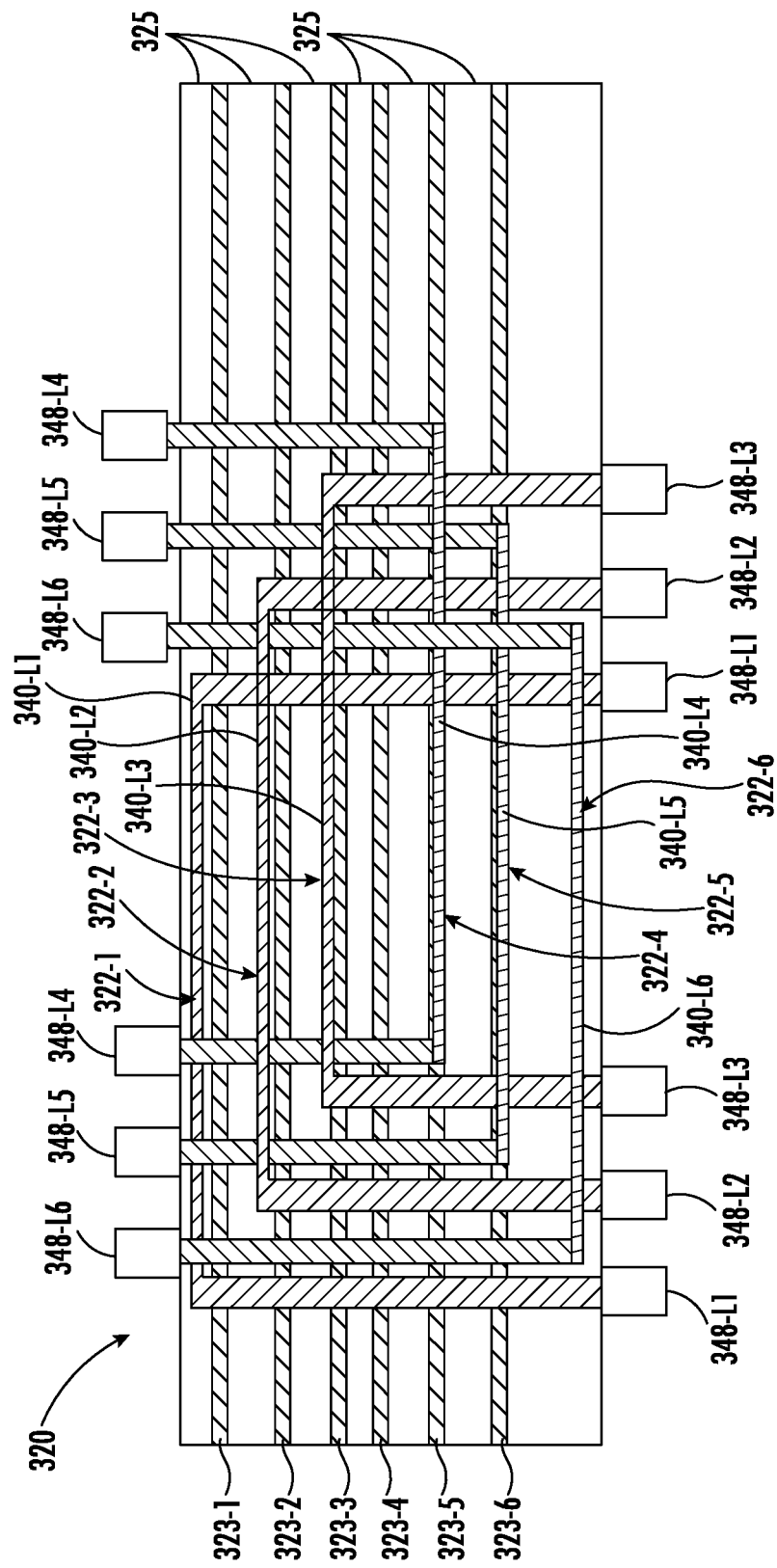
FIG. 4B is a sectional view of the example PCB of FIG. 4A taken along line 4B-4B.
Figure 4C:
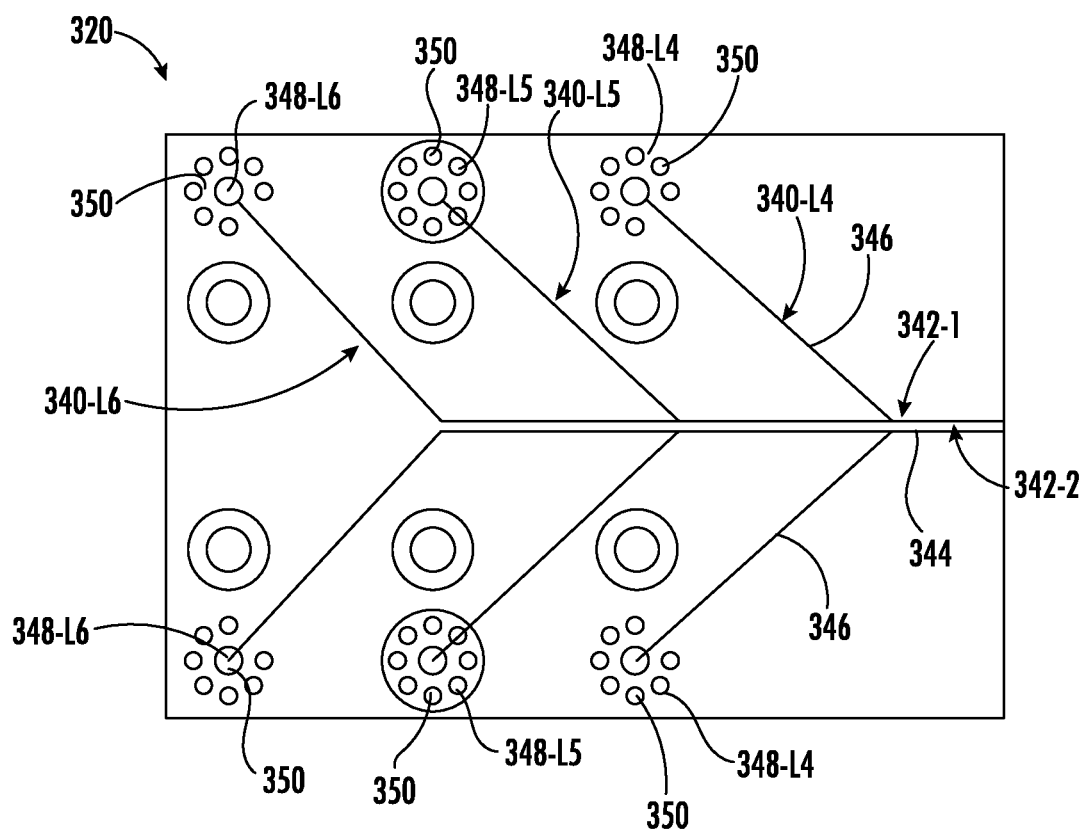
FIG. 4C is an enlarged fragmentary view of a portion of the PCB of FIG. 4A.

FIGS. 4A, 4B and 4C illustrate portions of an example multilayer PCB 320. FIG. 4A is a top view of PCB 320. FIG. 4B is a sectional view of PCB 320 taken along line 4B-4B. FIG. 4C is an enlarged view of a portion of the top surface of PCB 320. As shown by FIG. 4B, PCB 320 comprises multiple signal layers, wherein the signal layers are separated by a ground layer. In the example illustrated, PCB 320 comprises signal layers 322-1, 322-2, 322-3, 322-4, 322-5 and 322-6 (collectively referred to as single layers 322) separated by intervening or interleaved ground layers 323-1, 323-2, 323-3, 323-4, 323-5 and 323-6 (collectively referred to as ground layers 323). Each of the signal layers 322 and ground layers 323 are spaced by intervening dielectric layers 325. Each of signal layers 322 comprises electrically conductive traces or circuit traces that are formed on an adjacent dielectric layer. In one implementation, the dielectric layer may comprise FR-4 glass epoxy. Ground layer 323-1 comprises an electrically conductive layer film sandwiched between the signal layers 322. Although not shown, PCB 320 may additionally comprise a power layer supplying electrical power to the signal layers 322.

As shown by FIG. 4A which illustrates the topmost signal layer 322-1, each of signal layers 322 comprises a functional region 324 and a signal layer testing region 330. Functional region 324 comprises those portions of each signal layer 322 that contain functional components, such as component 32 (shown in broken lines). Functional region 324 contains those functional components 32 that serve to provide the functions associated with PCB 320. Examples of such functional component 32 include, but are not limited to, central processing units (CPUs), random access memories such as synchronous data random access memories or double data rate synchronous dynamic random access memories, field programmable gate arrays (FPGAs), single-ended and differential pair traces, capacitors, via transitions, and connectors. Functional region 324 covers a majority of the available topmost surface area and/or bottommost surface area of PCB 20.

Signal layer testing region 330 comprises those portions of the surface of a signal layer 322 that do not contain functional components 32 or their associated electrical traces or circuit traces. Signal layer testing region 330 may generally extend along a perimeter of PCB signal layer 322. In some implementations, signal layer testing region 330 may extend along opposite sides are opposite ends of functional region 324. Signal layer testing region 330 is generally the leftover space on each signal layer 322 after the functional region 324 has been laid out and patterned. Signal layer testing region 330 of each of signal layers 322 contains various electrical or conducting structures that facilitate the testing of the material properties of the particular signal layer 322 or of PCB 320 in general.

As shown by FIG. 4B, signal layers 322 comprise perspective differential pairs 340-L1, 340-L2, 340-L3, 340-L4, 340-L5 and 340-L6 (collectively referred to as differential pairs 340), in their respective signal layer testing regions 330. Differential pairs 340 are used for differential signaling, a method for electrically transmitting information using two complementary signals. Such differential signaling sense the same electrical signal as a differential pair of signals, each in its own conductor or trace of the pair of traces. As shown by FIG. 4C, each of differential pairs 340 comprises a pair of electrically conductive traces 342-1, 342-2 (collectively referred to as traces 342). Traces 342 are substantially similar to one another in all respects, length, shape, thickness and the like but for the two traces of each differential pair mirroring one another. Traces 342 each include a linear portion 344 and a diverging portion 346 at each opposite end of linear portion 344. Diverging portions 346 are electrically connected to electrically conductive vias 350 which extend through at least one ground layer to electrical connectors, probes, contact pads or terminals 348-L1, 348-L2 (collectively referred to as terminals 348) which are on an exposed surface of PCB 320 in which facilitate electrical connection to an electrical probe or connector.

As shown by FIG. 4B, the electrical terminals can be in both top and bottom layers of a PCB. For example, for a 6 signal layer PCB (top and bottom included) terminals for the differential pairs of signal layers 1-3 may be located in signal layer 6 and terminals for the differential pairs of signal layers 4-6 may be placed in signal layer 1. For signal layers 2-5 such terminals may be placed in either top or bottom signal layer. However, terminals for the differential pairs of the topmost signal layer are located in the bottommost signal layer and vice versa. In the example illustrated, differential pair 340-L1 terminates at terminals 348-L1. Differential pair 340-L2 terminates at terminals 348-L2.

Terminals 348 are located at or extend to an outer face or outer surface of PCB 320 for connection to electrical probes or connectors. As further shown by FIGS. 4B and 4C, at least a portion of differential pair 340-L4 directly overlies a portion of differential pair 340-L5 which directly overlies a portion of differential pair 340-L6. Although overlapping one another, differential pairs 340-L4, 340-L5 and 340-L6 are offset from one another such that terminals 348 of the respective differential pairs 340-L4, 340-L5 and 340 L6 are also offset or spaced from one another along the outer face or outer surface of PCB 320. Because terminals 348 are offset or spaced from one another, electrical connection may be made with each of the differential pairs 340-L4, 340-L5 and 340-L6 on the top surface or the bottom surface of PCB 320 for taking electrical measurements for carrying out method 100 described above. At the same time, because differential pairs 340-L4, 340-L5 and 340-L6 overlap one another, terminals 348 may be more closely spaced to one another along the top surface of PCB 320, conserving space on the top surface of PCB 320 for other purposes, such as other PCB testing electrical contacts or electrical components. In some implementations, the signal layer testing region 330 may itself be smaller, facilitating and more compact and lower cost PCB 320.

In the example illustrated, linear portions 344 of traces 342-1, 342-2 of differential pair 340-L4 directly overlie corresponding linear portions 344 of traces 342-1, 342-2 of differential pair 340-L5 which also directly overlie corresponding linear portion 344 of traces 342-1, 342-2 of differential pair 340-L6. Diverging portions 346 branch away from one another from the respectively near portions 344 further facilitating the offset of terminals 348. In other implementations, other portions of differential pairs 340-L4, 340-L5 and 340-L6 may overlap, directly overlie or directly underlie one another.

In the example illustrated, the bottom of PCB 320 and signal layers 323-1, 323-2 and 323-3 mirror the top of PCB 320 and signal layers 323-6, 326-5 and 323-4, respectively. The bottom of PCB layer 320 would have a similar construction and appearance as shown in FIGS. 4a and 4C with respect to the top of PCB 320. Signal layers 323-1, 323-2 and 323-3 terminate at terminals 348-1, 348-2 and 348-3, respectively. At least a portion of differential pair 340-L1 directly overlies a portion of differential pair 340-L2 which directly overlies a portion of differential pair 340-L3. Although overlapping one another, differential pairs 340-L1, 340-L2 and 340-L3 are offset from one another such that terminals 348 of the respective differential pairs 340-L1, 340-L2 and 340-L3 are also offset or spaced from one another along the outer face or outer surface of PCB 320. Because terminals 348 are offset or spaced from one another, electrical connection may be made with each of the differential pairs 340-L1, 340-L2 and 340-L3 on the bottom surface or the bottom surface of PCB 320 for taking electrical measurements for carrying out method 100 described above. At the same time, because differential pairs 340-L1, 340-L2 and 340-L3 overlap one another, terminals 348 may be more closely spaced to one another along the bottoms surface of PCB 320, conserving space on the bottom surface of PCB 320 for other purposes, such as other PCB testing electrical contacts or electrical components.

Figure 5:
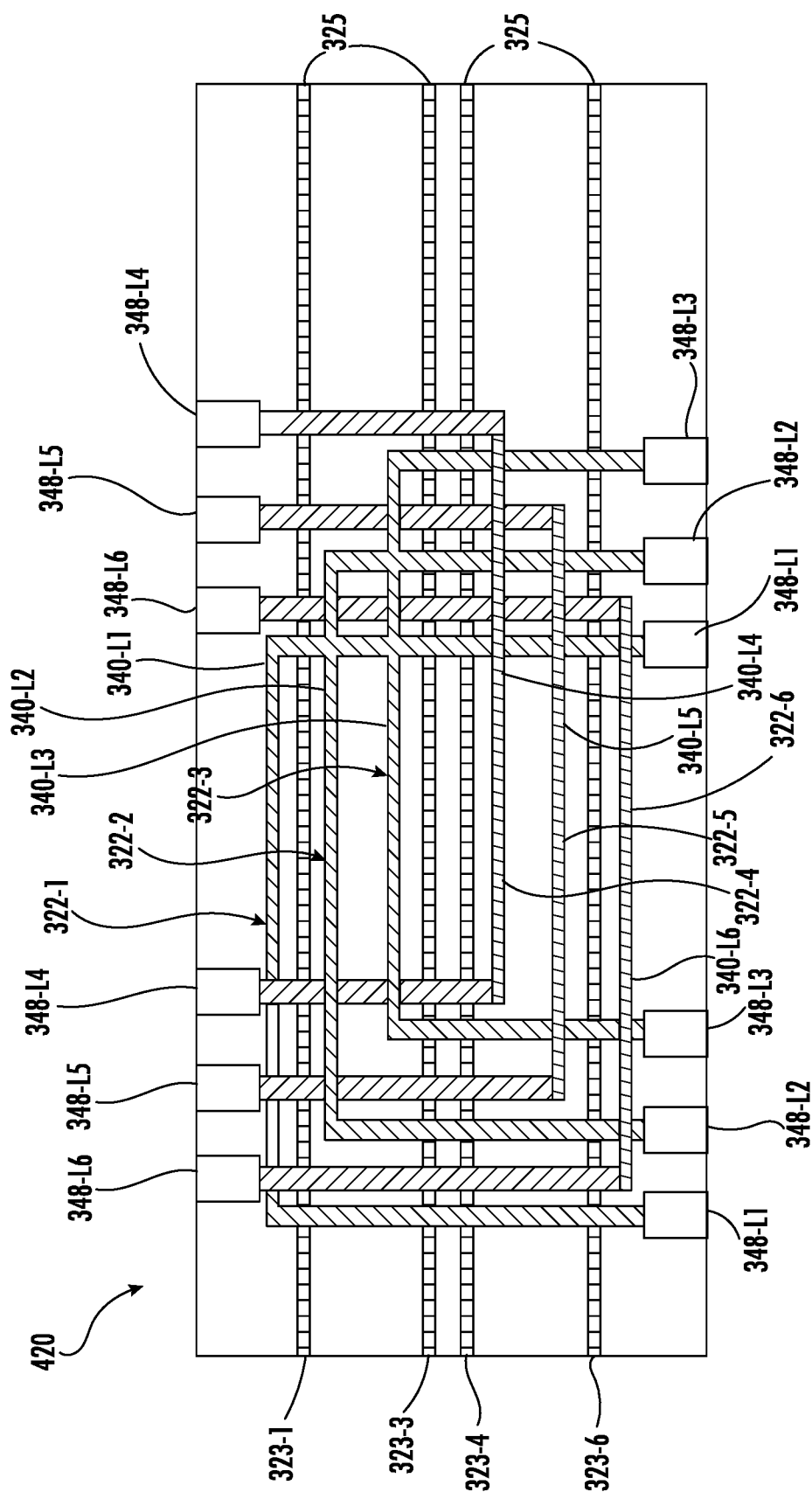
FIG. 5 is a sectional view schematically illustrating portions of an example PCB, sectional view taken along line 5-5 of FIG. 4A.

FIG. 5 is a sectional view space of portions of an example PCB 420. PCB 420 is similar to PCB 320 described above except that PCB 420 omits ground layers 323-2 and 323-5 (shown in FIG. 4B). In PCB 420, though signal layers that are not separated by an intermediate ground layer, signal layers 322-2 and 322-3 and signal layers 322-4 and 322-5 may be referred to as dual strip lines. As with PCB 320, PCB 420 comprises terminals 348 are offset or spaced from one another, electrical connection may be made with each of the differential pairs 340-L4, 340-L5 and 340-L6 on the top surface or the bottom surface of PCB 320 for taking electrical measurements for carrying out method 100 described above. At the same time, because differential pairs 340-L4, 340-L5 and 340-L6 overlap one another, terminals 348 may be more closely spaced to one another along the top surface of PCB 320, conserving space on the top surface of PCB 320 for other purposes, such as other PCB testing electrical contacts or electrical components. The same benefits occur with respect to the bottommost surface of PCB 320. In some implementations, the signal layer testing region 330 may itself be smaller, facilitating and more compact and lower cost PCB 320.

Figure 6:
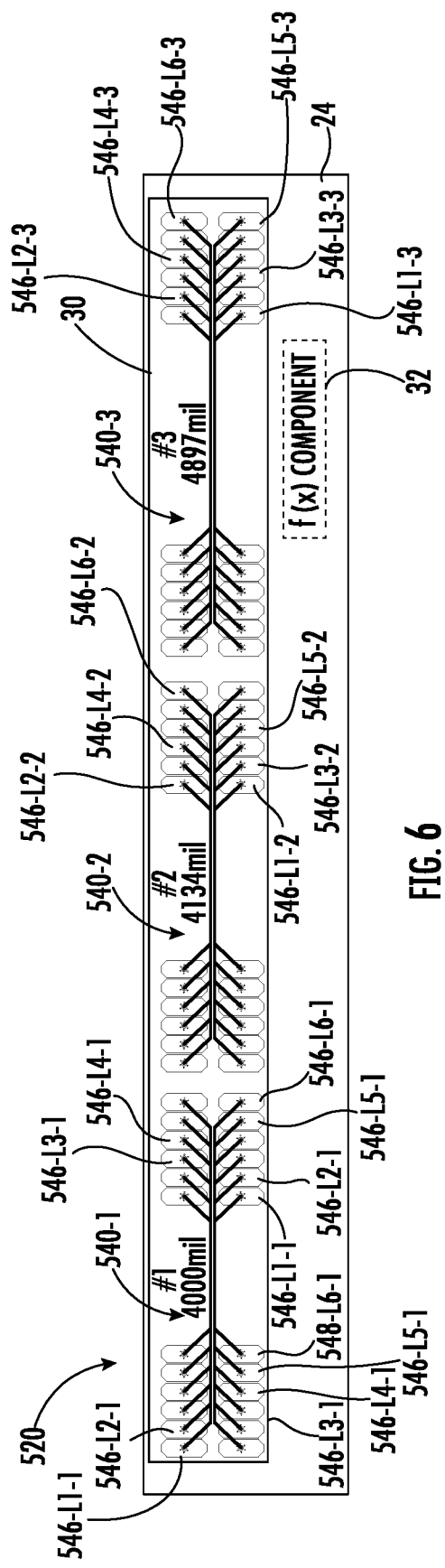
FIG. 6 is a top view illustrating portions of an example PCB.

FIG. 6 is a top view of portions of an example PCB 520. PCB 520 is similar to PCB 20 described above in that PCB 520 comprises at least three differential pairs on at least one signal layer, wherein each of the three differential pairs on a particular signal layer have different lengths. In the example illustrated, PCB 520 is a multilayer PCB having multiple signal layers which are spaced by intervening grounding layers. Each of the signal layers comprises a functional region 24 containing functional components 32 (one of which is shown in broken lines) and a layer testing region 30 (both being described above). In the example illustrated, each signal layer comprises differential pairs 540-1, 540-2 and 540-3 of different lengths.

Each of the pairs 540 is comprised of two identical electrically conductive lines extending generally alongside one another as a pair. Each pair a different length, the distance between and's or terminals of each electric conductive tracer line. In one implementation, differential pair 540-1 has a length of at least 2 inches and no greater than 4 inches. Differential pair 540-2 has a length of at least 4 inches and no greater than 5 inches. Differential pair 540-3 has a length of at least 4.5 inches and no greater than 10 inches. In the example illustrated, differential pair 540-1 has a length of 4 inches (4000 mils), differential pair 540-2 has a length of 4.134 inches (4134 mils) and differential pair 540-3 has a length of 4.897 inches (4897 mils). Because signal layer testing region 30 of each of the signal layers comprises at least three differential pairs, each pair having a different length with respect to the other pairs, the differential signaling performed using pairs 540 provides more accurate estimates for the propagation constant which may yield more accurate estimates for dielectric properties for the particular PCB signal layer. In those particular implementations where the differential pairs 540 have lengths within the three above described ranges, the accuracy of the propagation constants and dielectric property estimates is further enhanced.

PCB 520 is similar to PCBs 320 and 420 described above in that the differential pairs of the signal layer testing regions 30 of different signal layers directly overlie or underlie one another so as to overlap one another while being offset from one another to expose their respective terminals along the uppermost and bottommost surfaces of PCB 520. Each of differential pairs 540-1, 540-2 and 540-3 are similar in shape as differential pair 340 described above. As with PCBs 320 and 420, PCB 520 includes a layout or arrangement of differential pairs on different signal layers that is compact and can save space on the topmost and bottommost signal layers of the PCB 520.

In the example illustrated, PCB 520 comprises six signal layers spaced by intervening ground layers and dielectric layers as shown in FIG. 4B or as shown in FIG. 5. Each of the six signal layers comprises the differential pairs 540-1, 540-2 and 540-3. Each of the differential pairs of each of the six signal layers terminates at electrical terminals exposed on either the top or the bottom of PCB 520. Each of the differential pairs 540-1 of the different signal layers directly overlie and overlap one another while being offset from one another. Each of the differential pairs 540-2 of the different signal layers directly overlie an overlap one another while being offset from one another. Likewise, each of the differential pairs 540-3 of the different signal layers directly overlie an overlap one another while being offset from one another.

In the example illustrated, each differential pair 540-1 of the topmost or first signal layer, of the third signal layer and of the fifth signal layer has four exposed terminals on the bottom of PCB 520. Differential pairs 540-1 of the first, third and fifth signal layers include terminals 548-L1-1, 548-L3-1 and 548-L5-1, respectively, exposed on the bottom of PCB 520. Differential pair 540-1 of the second signal layer (from the top), of the fourth signal layer and of the bottom or sixth signal layer have four exposed terminals on the top of PCB 520. Differential pairs 540-1 of the second, fourth and sixth signal layers have terminals 548-L2-1, 548-L4-1, 548-L6-1, respectively, exposed on the top of PCB 520.

Each differential pair 540-2 of the topmost or first signal layer, of the third signal layer and of the fifth signal layer has four exposed terminals on the bottom of PCB 520. Differential pairs 540-2 of the first, third and fifth signal layers include terminals 548-L1-2, 548-L3-2 and 548-L5-2, respectively, exposed on the bottom of PCB 520. Differential pair 540-2 of the second signal layer (from the top), of the fourth signal layer and of the bottom or sixth signal layer have four exposed terminals on the top of PCB 520. Differential pairs 540-2 of the second, fourth and sixth signal layers have terminals 548-L2-2, 548-L4-2, 548-L6-2, respectively, exposed on the top of PCB 520.

Each differential pair 540-3 of the topmost or first signal layer, of the third signal layer and of the fifth signal layer has four exposed terminals on the bottom of PCB 520. Differential pairs 540-3 of the first, third and fifth signal layers include terminals 548-L1-3, 548-L3-3 and 548-L5-3, respectively, exposed on the bottom of PCB 520. Differential pair 540-3 of the second signal layer (from the top), of the fourth signal layer and of the bottom or sixth signal layer have four exposed terminals on the top of PCB 520. Differential pairs 540-3 of the second, fourth and sixth signal layers have terminals 548-L2-3, 548-L4-3, 548-L6-3, respectively, exposed on the top of PCB 520.

Figure 7:
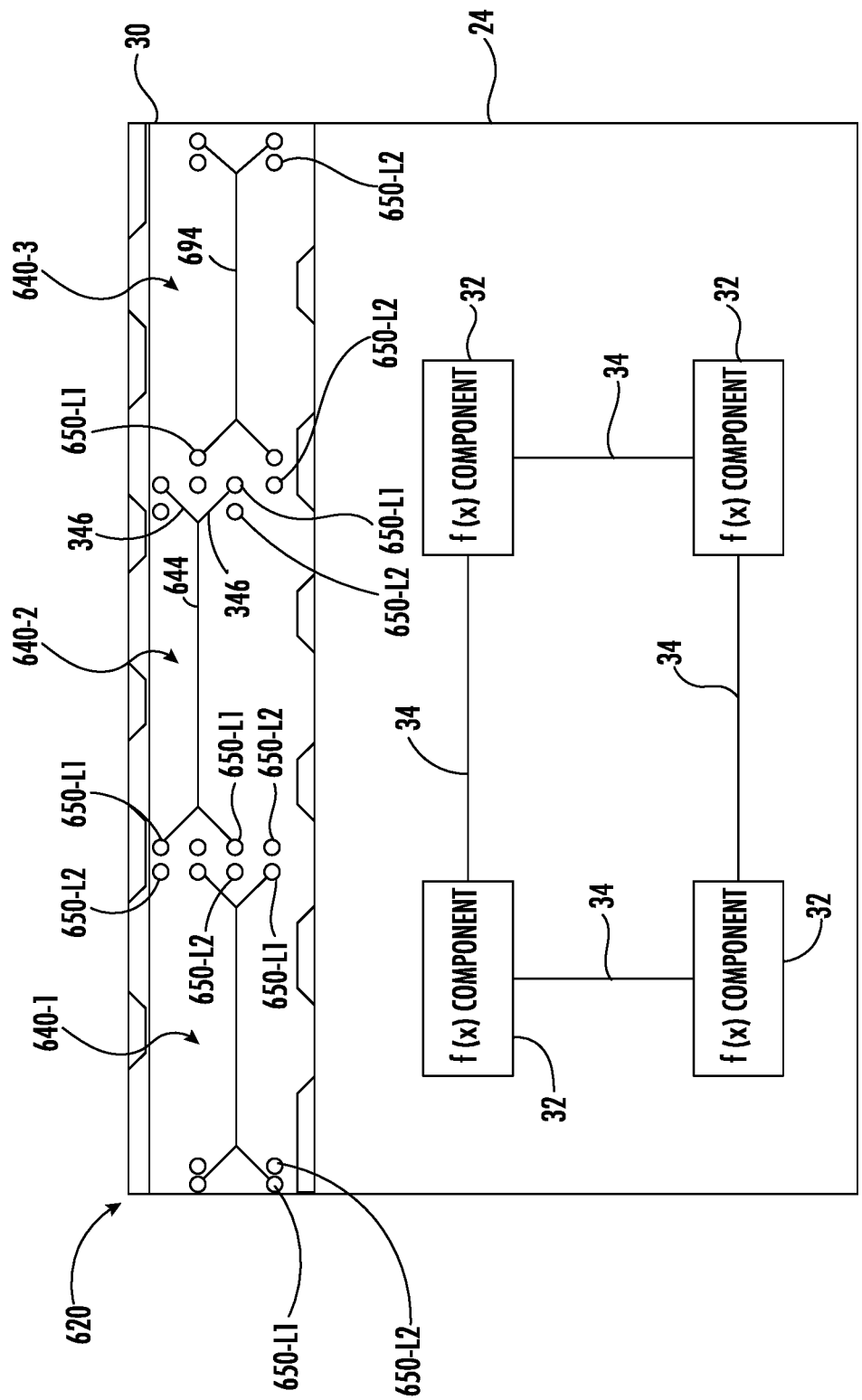
FIG. 7 is a top view illustrating portions of an example PCB.

FIG. 7 is a top view of portions of an example PCB 620. PCB 620 is similar to PCB 20 described above in that PCB 620 comprises at least three differential pairs on at least one signal layer, wherein each of the three differential pairs on a particular signal layer have different lengths. In the example illustrated, PCB 620 is a multilayer PCB having multiple signal layers which are spaced by intervening grounding layers. Each of the signal layers comprises a functional region 24 containing functional components 32 (one of which is shown in broken lines) and a signal layer testing region 30 (both being described above). In the example illustrated, each signal layer comprises differential pairs 640-1, 640-2 and 640-3 of different lengths.

Each of the pairs 640 is comprised of two identical electrically conductive lines extending generally alongside one another as a pair. Each pair a different length, the distance between and's or terminals of each electric conductive tracer line. In one implementation, differential pair 640-1 has a length of at least 2 inches and no greater than 4 inches. Differential pair 640-2 has a length of at least 4 inches and no greater than 5 inches. Differential pair 640-3 has a length of at least 4.5 inches and no greater than 10 inches. In the example illustrated, differential pair 640-1 has a length of 4 inches (4000 mils), differential pair 640-2 has a length of 4.134 inches (4134 mils) and differential pair 640-3 has a length of 4.897 inches (4897 mils). Because signal layer testing region 30 of each of the signal layers comprises at least three differential pairs, each pair having a different length with respect to the other pairs, the differential signaling performed using pairs 640 provides more accurate estimates for the propagation constant which may yield more accurate estimates for dielectric properties for the particular PCB signal layer. In those particular implementations where the differential pairs 640 have lengths within the three above described ranges, the accuracy of the propagation constants and dielectric property estimates is further enhanced.

PCB 620 is similar to PCBs 320 and 420 described above in that the differential pairs of the signal layer testing regions 30 of different signal layers directly overlie or underlie one another so as to overlap one another while being offset from one another to expose their respective terminals along the uppermost and bottommost surfaces of PCB 620. Each of differential pairs 640-1, 640-2 and 640-3 are similar in shape as differential pair 340 described above. As with PCBs 320 and 420, PCB 620 includes a layout or arrangement of differential pairs on different signal layers that is compact and conserves space on the topmost and bottommost signal layers of the PCB 620.

In the example illustrated, PCB 620 comprises two signal layers (an exterior signal layer which is shown). As with the differential pairs of the different signal layers of PCB 320 and 520, the differential pairs of the different signal layers of PCB 620 directly overlap one another and are offset from one another. However, unlike the differential pairs 540-1, 540-2 and 540-3 of PCB 520 which are illustrated as being aligned end-to-end, the differential pairs 640-1, 640-2 in 640-3 on each of the two signal layers are staggered relative to one another.

As shown by FIG. 7, the differential pairs 540-1, 540-2 and 540-3 on each signal layer are staggered and closely spaced to one another such that a via of each differential pair is aligned with the linear portion of another differential pair. In the example illustrated, differential pair 640-2 on the illustrated topmost signal layer has a via 650-L1 that is in alignment with the linear portions 644 of differential pair 640-1 and 640-3 on the topmost signal layer. Differential pair 640-1 of the topmost signal layer has a via 650-L1 in alignment with the linear portion 644 of differential pair 640-2. Differential pair 640-3 has a via 650-L1 in alignment with the linear portion of differential pair 640-2 on the same topmost signal layer of PCB 620. The differential pairs 640-1, 640-2 and 643 on the underlying PCB signal layer have a similar arrangement of terminals 648.

As further shown by FIG. 7, the staggering of the differential pairs on each signal layer and the offsetting of the differential pairs of different layers may result in the vias of a differential pair on one signal layer being nested between the vias 350 and/or divergent portions 346 of a differential pair on another signal layer. For example, the differential pair 640-2 of the underlying signal layer is illustrated as having a via 650-L2 that is in alignment with the linear portion 644 of the differential pair 640-1 on the topmost signal layer and which is also nested between the vias 650-L1 of the differential pair 640-1 on the top signal layer. This inter-nesting of vias further facilitates a more compact arrangement of differential pair vias and terminals, further conserving space on the topmost or bottommost signal layer of the PCB 620.

Although the present disclosure has been described with reference to example implementations, workers skilled in the art will recognize that changes may be made in form and detail without departing from the spirit and scope of the claimed subject matter. For example, although different example implementations may have been described as including features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A printed circuit board (PCB) comprising:
   a signal layer, the signal layer comprising a functional region and a PCB signal layer testing region, the PCB signal layer testing region comprising:
   a first differential pair having a first length formed on the signal layer;
   a second differential pair having a second length, different than the first length, formed on the signal layer; and
   a third differential pair having a third length, different than the first length and different than the second length, formed on the signal layer.

2. The printed circuit board of claim 1, wherein the first length is at least 2 inches and no greater than 4 inches, wherein the second length is at least 4 inches and no greater than 5 inches and wherein the third length is at least 4.5 inches and no greater than 10 inches.

3. The printed circuit board of claim 2 further comprising:
   a second signal layer, the second signal layer comprising a second functional region and a second testing region, the second testing region comprising:
   a fourth differential pair having a fourth length formed on the second signal layer;
   a fifth differential pair having a fifth length, different than the fourth length, formed on the second signal layer; and
   a sixth differential pair having a sixth length, different than the fourth length and different than the fifth length, formed on the second signal layer, wherein the signal layer and the second signal layer form a stack of signal layers.

4. The printed circuit board of claim 3, wherein the first differential pair and the fourth differential pair are similar in shape and length and wherein at least a portion of the first differential pair directly overlies a portion of the fourth differential pair.

5. The printed circuit board of claim 4, wherein the first differential pair comprises a first pair of parallel electrically conductive trace portions, wherein the fourth differential pair comprises a second pair of parallel electrically conductive trace portions and wherein the first pair of parallel electrically conductive trace portions directly overlie the second pair of parallel electrically conductive trace portions in the stack.

6. The printed circuit board of claim 4, wherein the signal layer is a topmost layer of the stack of signal layers, wherein the second signal layer is the bottommost signal layer of the stack of signal layers, wherein the first differential pair has a corresponding first set of electrical contacts on the second signal layer and wherein the fourth differential pair has a corresponding second set of electrical contacts on the signal layer, the second set of electrical contacts being offset from the first set of electrical contacts.

7. The printed circuit board of claim 3 further comprising:
   a third signal layer, the third signal layer comprising a third functional region and a third testing region, the third testing region comprising:
   a seventh differential pair having a seventh length formed on the second signal layer;
   an eighth differential pair having a fifth length, different than the seventh length, formed on the third signal layer; and
   a ninth differential pair having a ninth length, different than the seventh length and different than the eight length, formed on the third signal layer, wherein the signal layer, the second signal layer and the third signal layer form the stack of signal layers.

8. The printed circuit board of claim 7, wherein the first differential pair and the seventh differential pair are similar in shape and length and wherein at least a portion of the first differential pair directly overlies a portion of the seventh differential pair.

9. The printed circuit board of claim 8, wherein the seventh differential pair comprises a third pair of parallel electrically conductive trace portions and wherein the first pair of parallel electrically conductive trace portions directly overlie the third pair of parallel electrically conductive trace portions in the stack.

10. The printed circuit board of claim 8, wherein the fourth differential pair has a corresponding third set of electrical contacts on the signal layer, the third set of electrical contacts being offset from the first set of electrical contacts and the second set of electrical contacts.

11. The printed circuit board of claim 1, wherein the testing region extends along a perimeter of the PCB.

12. The printed circuit board of claim 1, wherein the testing region omits circuitry other than circuitry dedicated to testing material properties of the signal layer.

13. A printed circuit board (PCB) signal layer testing method comprising:
   receiving a first electrical measurement taken from a first differential pair on a PCB signal layer, the first differential pair having a first length;
   receiving a second electrical measurement taken from a second differential pair on the PCB signal layer, the second differential pair having a second length different than the first length;
   receiving a third electrical measurement taken from a third differential pair on the PCB signal layer, the third differential pair having a third length different than the first length and different than the second length;
   determining a propagation constant value at each measured frequency for the PCB signal layer based upon a combination of each of the first electrical measurement, the second electrical measurement and the third electrical measurement; and determining an averaged relative permittivity of the signal layer at each measured frequency using propagation constant values for the PCB signal layer based upon a combination of each of the first electrical measurement, the second electrical measurement and the third electrical measurement.

14. The method of claim 13, wherein the first length is at least 2 inches and no greater than 4 inches, wherein the second length is at least 4 inches and no greater than 5 inches and wherein the third length is at least 4.5 inches and no greater than 10 inches.

15. The method of claim 13 further comprising:
receiving a fourth electrical measurement taken from a fourth differential pair on a second PCB signal layer, the fourth differential pair having a first length;
receiving a fifth electrical measurement taken from a fifth differential pair on the second PCB signal layer, the fifth differential pair having a second length different than the first length;
receiving a sixth electrical measurement taken from a sixth differential pair on the second PCB signal layer, the sixth differential pair having a sixth length different than the fourth length and different than the fifth length; and
determining a propagation constant value at each measured frequency for the second PCB signal layer based upon a combination of each of the fourth electrical measurement, the fifth electrical measurement and the sixth electrical measurement, wherein the first differential pair and the fourth differential pair are similar in shape and length and wherein at least a portion of the first differential pair directly overlies a portion of the fourth differential pair.

16. The method of claim 15 further comprising:
contacting a first set of contacts of the first differential pair, with an electrical connector or a probe; and
contacting a second set of contacts of the fourth differential pair, with the electrical connector or a probe, wherein the second set of contacts are offset from second set of contacts on the PCB signal layer.

17. A printed circuit board (PCB), the PCB comprising:
a stack of signal layers comprising:
a first signal layer comprising a first functional region and a first PCB signal layer testing region, the first PCB signal layer testing region comprising a first differential pair;
a second signal layer comprising a second functional region and a second PCB signal layer testing region, the second PCB signal layer testing region comprising a second differential pair, wherein the first differential pair and the second differential pair are similar in shape and length and wherein at least a portion of the first differential pair directly overlies a portion of the second differential pair;
wherein the first signal layer and the second signal layer each comprise at least three differential pairs of a same size and geometry, the at least three differential pairs of the first signal layer being offset from the at least three differential pairs of the second signal layer.

18. The printed circuit board of claim 17, wherein the first differential pair comprises a first pair of parallel electrically conductive trace portions, wherein the second differential pair comprises a second pair of parallel electrically conductive trace portions and wherein the first differential pair directly overlies the second differential pair in the stack.

19. The printed circuit board of claim 17, wherein the first differential pair has a corresponding first set of electrical contacts on the first signal layer, wherein the second differential pair has a corresponding second set of electrical contacts on the first signal layer, the second set of electrical contacts being offset from the first set of electrical contacts.

* * * * *